(12) United States Patent
Wyszynski

(10) Patent No.: US 7,098,731 B1
(45) Date of Patent: Aug. 29, 2006

(54) SYNTHESIS METHOD FOR AN ACTIVE POLYPHASE FILTER

(76) Inventor: Adam S. Wyszynski, 1512 Highland Cir., Little Elm, TX (US) 75068-3787

(*) Notice: Subject to any disclaimer, the term of this patent is extended or adjusted under 35 U.S.C. 154(b) by 102 days.

(21) Appl. No.: 10/755,298

(22) Filed: Jan. 13, 2004

(51) Int. Cl.
*H03B 1/00* (2006.01)
(52) U.S. Cl. ........................................ 327/557; 327/552
(58) Field of Classification Search ............... 327/557
See application file for complete search history.

(56) References Cited

U.S. PATENT DOCUMENTS

| | | | |
|---|---|---|---|
| 4,696,055 A | | 9/1987 | Marshall |
| 4,723,318 A | | 2/1988 | Marshall |
| 4,823,092 A | * | 4/1989 | Pennock ............... 330/253 |
| 4,914,408 A | | 4/1990 | Voorman |
| 5,440,264 A | * | 8/1995 | Sevenhans et al. ...... 327/553 |
| 5,625,317 A | * | 4/1997 | Deveirman ............. 327/553 |
| 6,035,186 A | | 3/2000 | Moore et al. |
| 6,104,236 A | * | 8/2000 | Tsinker ................. 327/557 |
| 6,335,655 B1 | * | 1/2002 | Yamamoto ............. 327/552 |
| 6,346,850 B1 | | 2/2002 | Essink |
| 6,441,682 B1 | | 8/2002 | Vinn et al. |
| 6,577,855 B1 | | 6/2003 | Moore et al. |

OTHER PUBLICATIONS

Jan Crols and Michiel Steyaert, "CMOS Wireless Transceiver Design," Building Blocks for CMOS Transceivers, Kluwer Academic Publishers (Boston/Dordrecht/London), p. 193-203, (1997).

* cited by examiner

*Primary Examiner*—Kenneth B. Wells
(74) *Attorney, Agent, or Firm*—Locke Liddell & Sapp LLP

(57) ABSTRACT

A fully-integrated continuous-time active complex bandpass IF filter that may contain transmission zeros yielding much sharper roll-off than that of an all-pole filter is implemented using transconductors and capacitors only. Each of the filter second-Order sections realizes a pair of complex poles and a may realize a double imaginary axis zero. Since the transconductors are electronically tunable the positions of filter zeros and poles are adjustable using an automatic tuning system. In each filter section the value of different transconductors are modified to separately change the pole frequency, its Q-factor and the zero frequency. Each pole and zero are separately tuned, which achieves a higher level of tuning accuracy than in case where all poles and zeros were adjusted simultaneously.

13 Claims, 16 Drawing Sheets

SYNTHESIS METHOD FOR AN ACTIVE POLYPHASE FILTER

TECHNICAL FIELD OF THE INVENTION

The present invention relates to fully-integrated continuous-time active complex band-pass filters and their synthesis method using transconductance amplifiers and capacitors that allows direct synthesis of their transfer function poles and transmission zeros.

BACKGROUND OF THE INVENTION

Complex bandpass (BP) active filters are widely used in integrated receivers. These filters serve primarily as intermediate-frequency (IF) channel select filters with an additional function of providing image rejection. Their ability to reject unwanted image frequencies of the preceding mixer results directly from their non-symmetrical transfer characteristic. Depending on its input signal conditioning, a complex BP filter transmits for positive frequencies and rejects all negative frequencies, or vice-versa, the filter transmits for negative frequencies and blocks all positive frequencies.

The achievable image-rejection ratio (IRR) depends on the matching of on-chip components used in the complex filter. These components include resistors, capacitors and transconductors. Also, non-ideal gain of operational amplifiers (opamps) if used for filter synthesis results in IRR degradation. The IRR performance also depends on the choice of synthesis method. Certain methods are more sensitive to component variation than others. Practically achievable IRR of a complex filter is 30–35 dB. If extreme caution is taken to achieve an excellent component matching, or if an IRR is enhanced by a special automatic tuning scheme IRR better than 55 dB is achievable.

Complex BP filters can be realized using two distinct synthesis methods: the active ladder simulation and the direct synthesis. Similarly to the classical passive LC ladder synthesis method, in the active ladder simulation the pole frequency and its quality (Q) factor are defined by all filter elements. Contrary, in the direct synthesis method the pole frequency and its Q factor are defined by elements of one particular filter section. Due to its lower sensitivity to the component value variation, the active ladder simulation method is superior to the direct synthesis method. However, the latter results in a simple circuit that is usually easier to integrate.

The complex bandpass filters can also be categorized according to the chosen active synthesis method. Two different active synthesis techniques have been used: the active-RC technique described in U.S. Pat. No. 4,914,408 and the gyrator method described in U.S. Pat. No. 6,346,850. In the active-RC method the transfer function is realized using active-RC integrators built with input series resistors and feedback capacitors around opamps. The gyrator method uses voltage-controlled current sources and capacitors to realize integrators. The advantage of the gyrator method over the active-RC method stems from the gyrator method's ability to adjust the filter pole frequency through adjusting the transconductance of voltage controlled current sources, which is not easily achievable in a R and C arrangement of the active RC filters.

Due to their prime application as channel select filters complex BP filters must demonstrate sharp roll-off outside their pass-bands. In wireless receiver system design, BP filter attenuation determines such critical parameters as co-channel and adjacent channel rejection. Steep roll-off is not easily achievable with all-pole transfer functions. Depending on their order all-pole transfer functions may be quite steep, but as illustrated in FIG. 7, their roll-off is never as steep as that of filters that contain transmission zeros in their transfer function. For all these reasons, in an integrated receiver design there is a strong need for complex BP filters with transmission zeros.

DESCRIPTION OF THE PRIOR ART

The arrangement for a complex all-pole (no transmission zeros) bandpass active ladder simulation scheme using active-RC integrators such as one described in U.S. Pat. No. 4,914,408 is illustrated in FIG. 1a, and is identified by the numeral 10. It consists of two identical banks of active-RC integrators 12 connected by the feedback resistors 14. Without these resistors each of the banks performs a lowpass function. The lowpass filter integrator banks 12 are connected in so called a leapfrog structure as shown in FIG. 1b, which is a common technique to simulate lossless ladders using active integrators. Two types of integrators are used. Lossy integrators 16 simulate the ladder first element with the source resistor and the ladder last element with the load resistor. Lossless integrators 18 simulate the reminding ladder elements. Since presented ladder is of $3^{rd}$-Order, only one lossless integrator 18 is necessary. Similar to the classical passive LC ladder synthesis method, in the active ladder simulation a single pole frequency and its quality (Q) factor are defined by all filter elements. Such structures are characterized by low sensitivities of their pole frequencies and Q-factors to the component value variation. However, since on-chip RC time-constants can vary as much as 30–40% the accuracy of cut-off frequency of a lowpass built with active-RC integrators if no tuning is applied is similarly low. When the feedback resistors 14 in FIG. 1a are connected, the complex signals shift the lowpass transfer functions by a frequency inversely proportional to the value of feedback resistor. This frequency shift causes the lowpass in FIG. 2a that is symmetrical around zero frequency to transform into the non-symmetrical (for positive or negative frequencies only) complex bandpass as shown in FIG. 2b. Again, if no tuning is available the accuracy of the frequency shift is as low as the on-chip RC time constant.

A different arrangement for a complex all-pole (no transmission zeros) bandpass active ladder simulation scheme built with gyrators is described in U.S. Pat. No. 6,346,850. As illustrated in FIG. 3a a gyrator identified by numeral 30 consists of two voltage-controlled current sources 31. The gyrator method uses gyrators and capacitors to realize integrators. The complex bandpass filter is illustrated in FIG. 3b and identified by numeral 32. Similarly to the previous method, it consists of two banks of integrators 34 cross-connected by gyrators 36. Since filter integrators are built with gyrators that consist of voltage-controlled current sources their transconductance can be adjusted to compensate for the process variation of on-chip capacitors and resistors. Also, since this is also an active ladder simulation method a single pole frequency and its quality (Q) factor are defined by all filter elements, which results in low sensitivities of these parameters to the component value variation.

Yet another arrangement for a complex all-pole (no transmission zeros) bandpass active ladder simulation scheme described in U.S. Pat. No. 6,441,682 is illustrated in FIG. 4 and identified by numeral 40. The scheme uses active-RC integrators similar to those described in U.S. Pat. No. 4,914,408 to build lowpass filters 42, but instead of using fixed resistors to shift the lowpass function the method uses voltage-controlled current sources 44. The advantage of voltage-controlled current sources over the fixed resistors is that voltage controlled current sources can be adjusted to compensate for unavoidable process variation of on-chip capacitors and resistors. However, since the remaining lowpass filter circuitry consists of active-RC integrators the accuracy of the lowpass cutoff frequency, with respect to the process variation, is similar to that of U.S. Pat. No. 4,914,408. Nevertheless, due to using the adjustable voltage-controlled current sources, the accuracy of the complex bandpass center frequency is expected to be better, similar to that of U.S. Pat. No. 6,346,850.

A different arrangement for a complex all-pole (no transmission zeros) bandpass active direct synthesis scheme has been described in a section of *CMOS Wireless Transceivers* by J. Crols and M. Steyaert, Kluwer Academic Publishers, pp. 193–203, 1997. The scheme is illustrated in FIG. 5a and identified by numeral 50. It is a feedback scheme that forms real pole using "−1" operators 51 and then translates the real pole into a pair of complex poles using cross-coupled operators "$\pm\omega_c/\omega_o$" 52. The proposed realization is illustrated in FIG. 5b and identified by numeral 54. Similarly to U.S. Pat. No. 4,914,408 it uses active-RC integrators, but instead of building the whole lowpass filters transfer function in a ladder structure, each pair of complex poles is realized directly. By using feedback resistors $R_Q$ 55 in cross-coupled configuration the pole positions are shifted by a frequency vector. This results in a complex bandpass transfer function. However, contrary to all previously described methods the individual pole frequency and its Q-factor values are defined by the component values of one particular filter section only. Therefore, the expected sensitivities of the pole parameters to the component value variation are higher than that of the active ladder simulation method. Also, since the pole frequencies are defined by the on-chip RC time constant, without the tuning, the accuracy of the center frequency and the bandwidth of the resulting complex bandpass is expected to be similar to that of U.S. Pat. No. 4,914,408. However, in the presented circuit the pole tunability is achieved by switching on and off binary weighted capacitors 56.

SUMMARY OF THE INVENTION

The present invention is used to implement a fully-integrated continuous-time active complex IF bandpass (BP) filter denoted by numeral 67 in a wireless receiver identified by numeral 60 in FIG. 6. The receiver consists of the following components: the low-noise amplifier 62, the real RF BP filter 64, the complex mixers 66, the complex IF BP filter 67 and the variable-gain amplifier 68. The present invention allows for incorporation of transmission zeros into the complex BP filter transfer function. As illustrated in FIG. 7, that yields the complex BP filter 71 with much sharper roll-off than that of an all-pole filter 72. The filter with transmission zeros 71 achieve the same attenuation of 45 dB, as illustrated by numeral 73, at 1.3 times its cutoff frequency, illustrated by the numeral 74, whereas the all-pole filter requires 1.5 times of its cutoff frequency, illustrated by the numeral 75, to achieve the same attenuation. The filter transfer function is constructed using transconductors and capacitors only. Each of the first-Order filter sections realizes one complex pole and a single zero at jω axis. Therefore, two consecutive filter sections realize a pair of complex poles and a double imaginary axis zero. Since the transconductors are electronically tunable, the positions of filter zeros and poles are adjustable using an automatic tuning system. The value of section transconductors and/or capacitors are modified to separately change the pole frequency, its Q-factor and the zero frequency. Each pole and zero are separately tuned, which achieves a much higher level of tuning accuracy than in case where all poles and zeros were adjusted simultaneously.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1A:
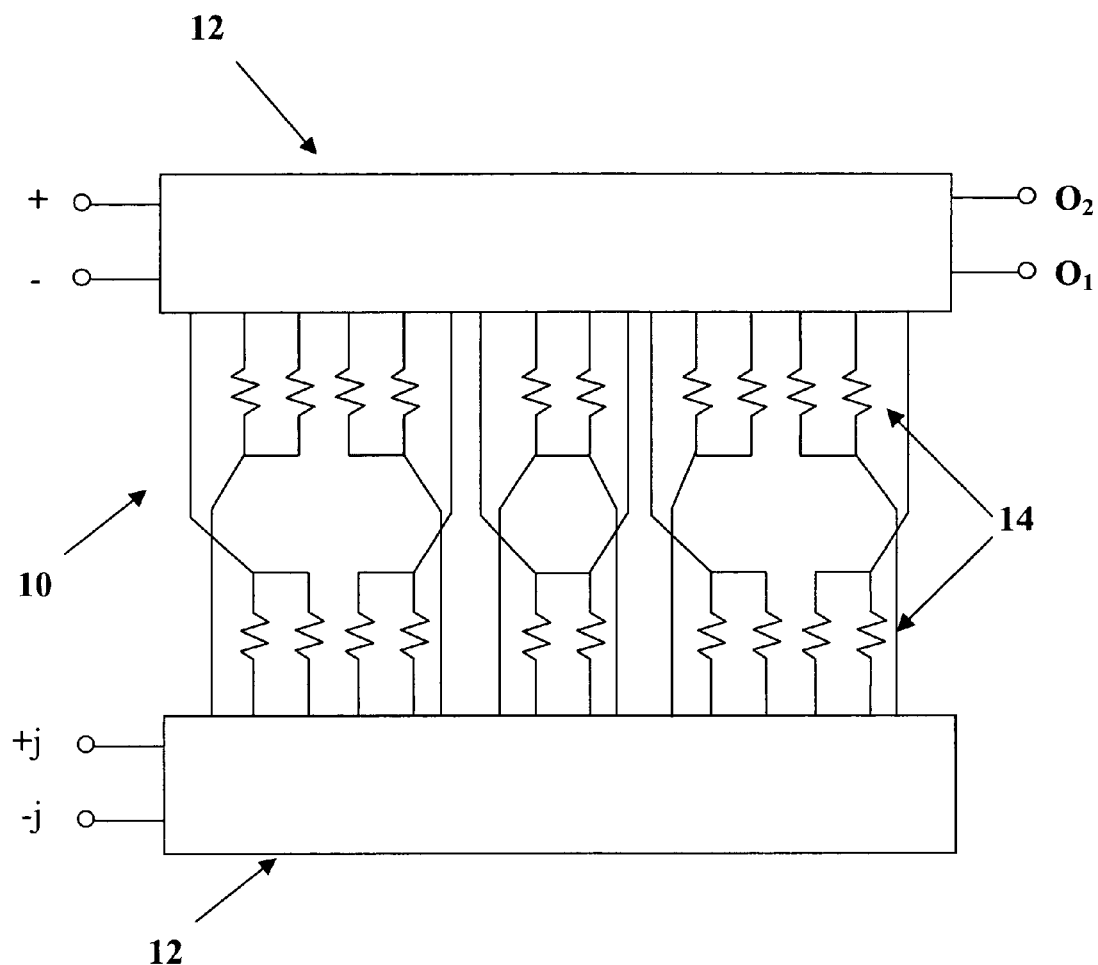
FIGS. 1a, 1b, 2a, 2b, 3a, 3b, 4, 5a, and 5b are block diagrams of prior art methods to realize active polyphase filters.
Figure 1B:
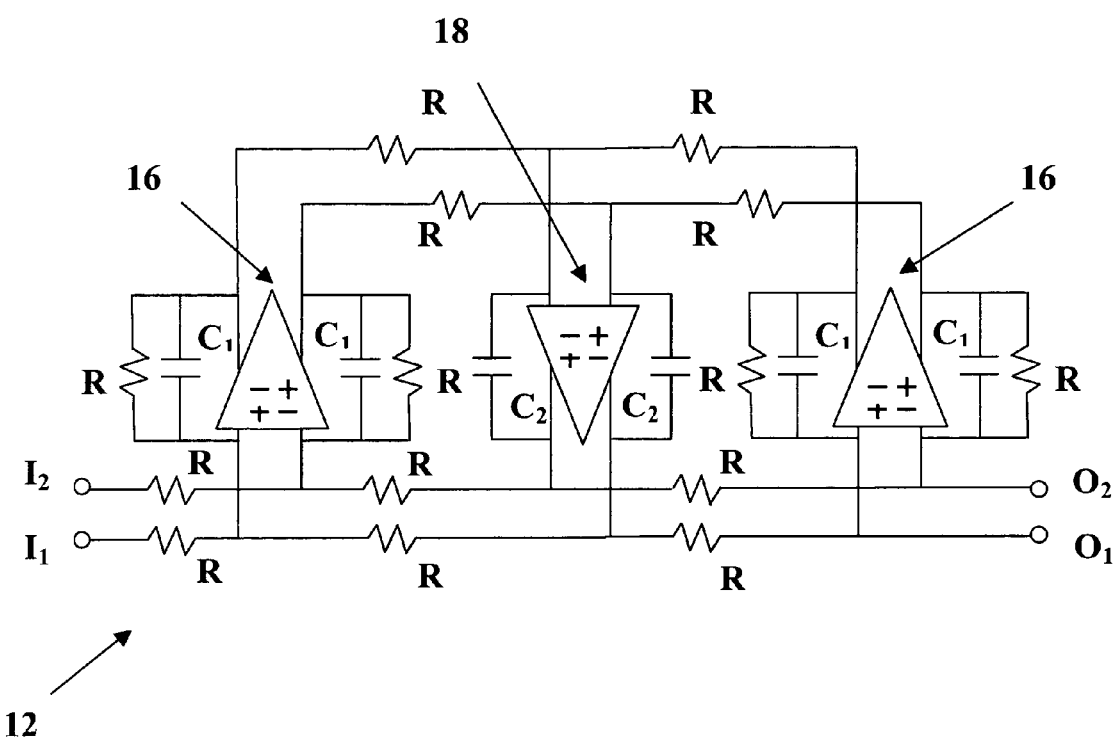
Figure 2A:
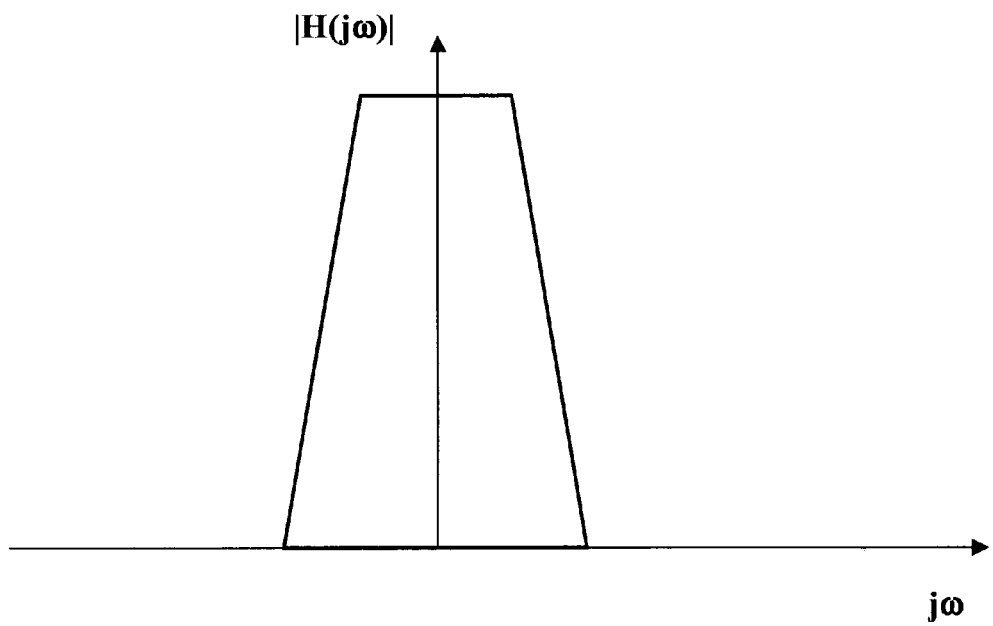
Figure 2B:
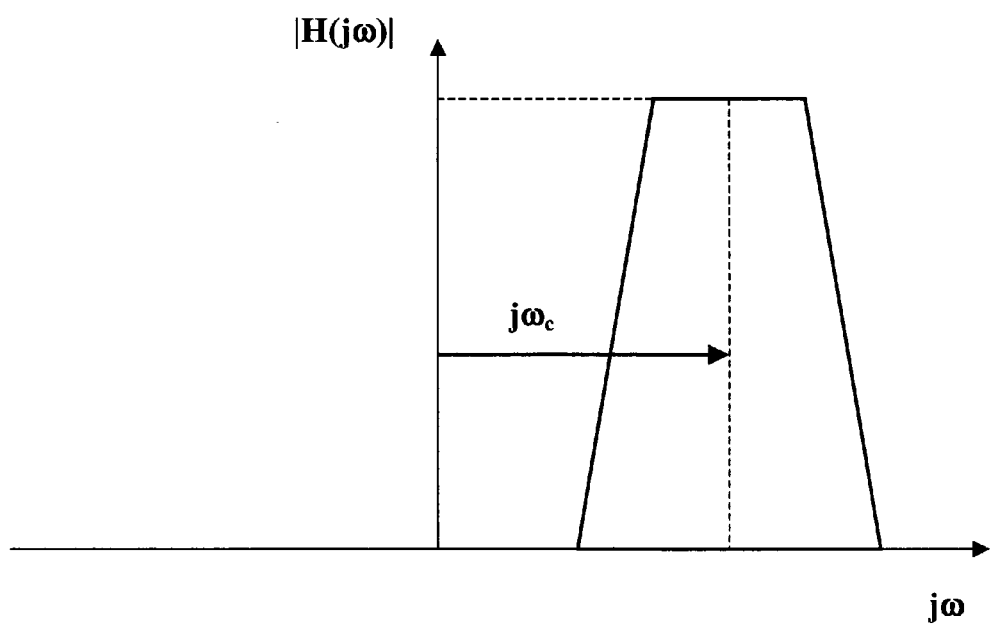
Figure 3A:
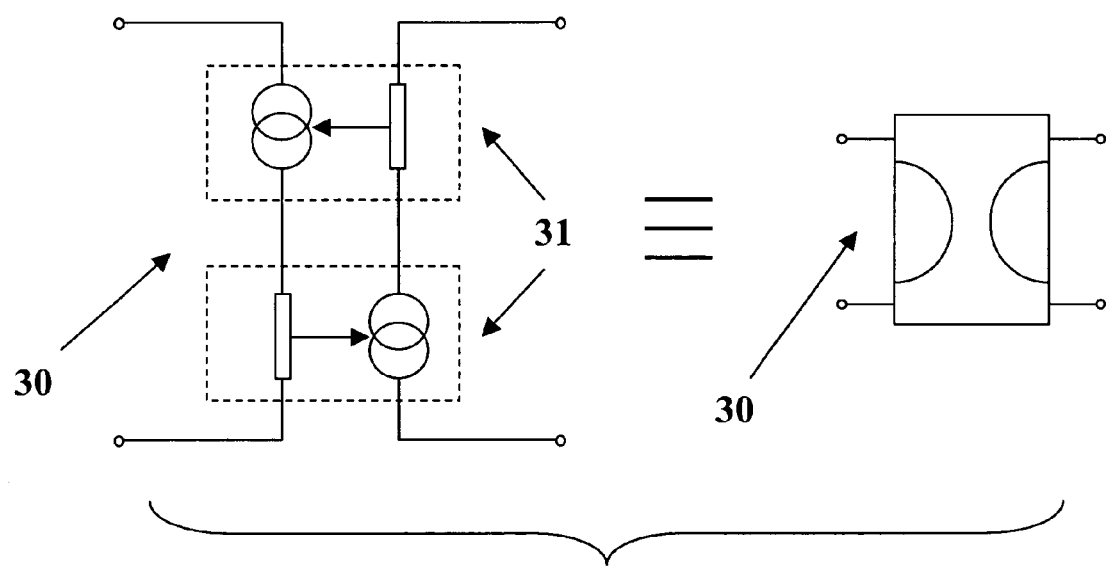
Figure 3B:
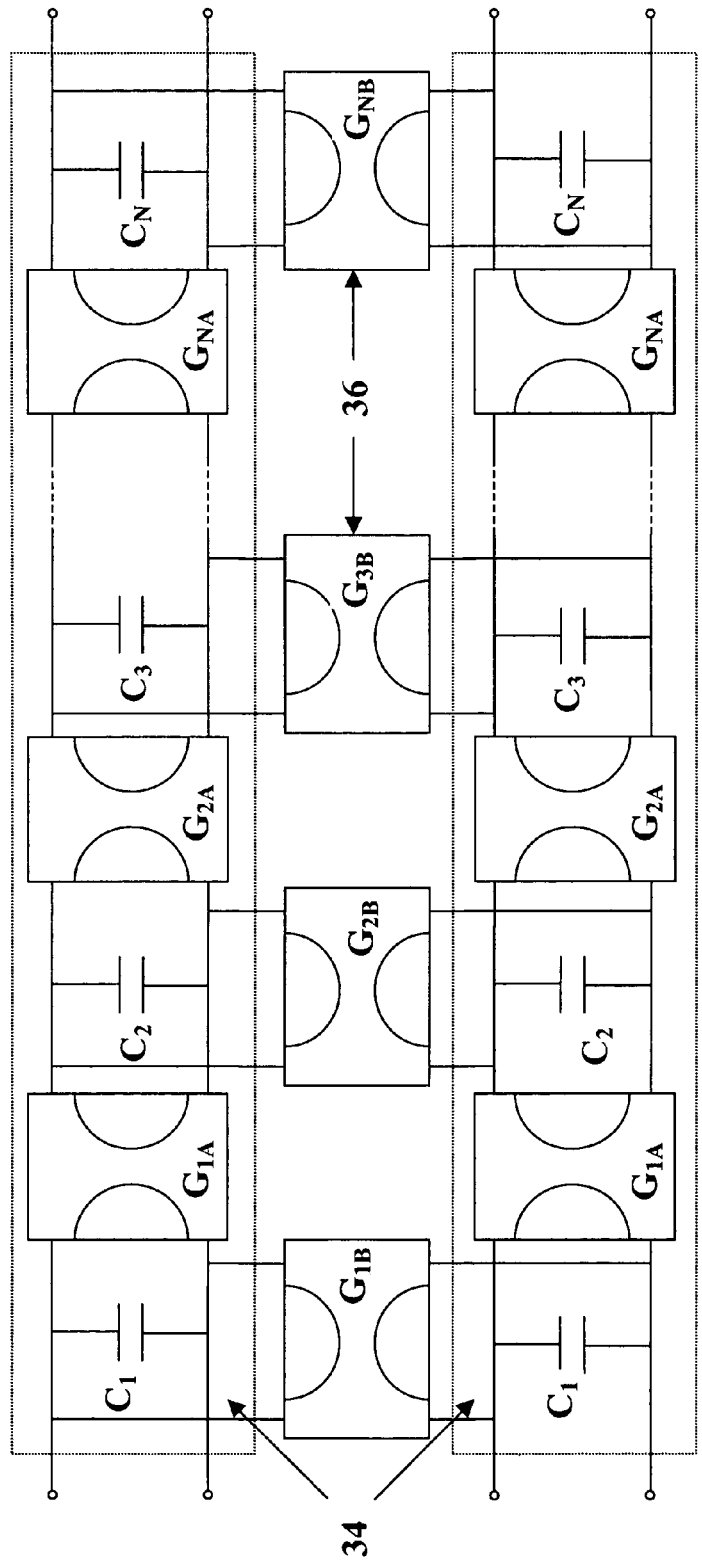
Figure 4:
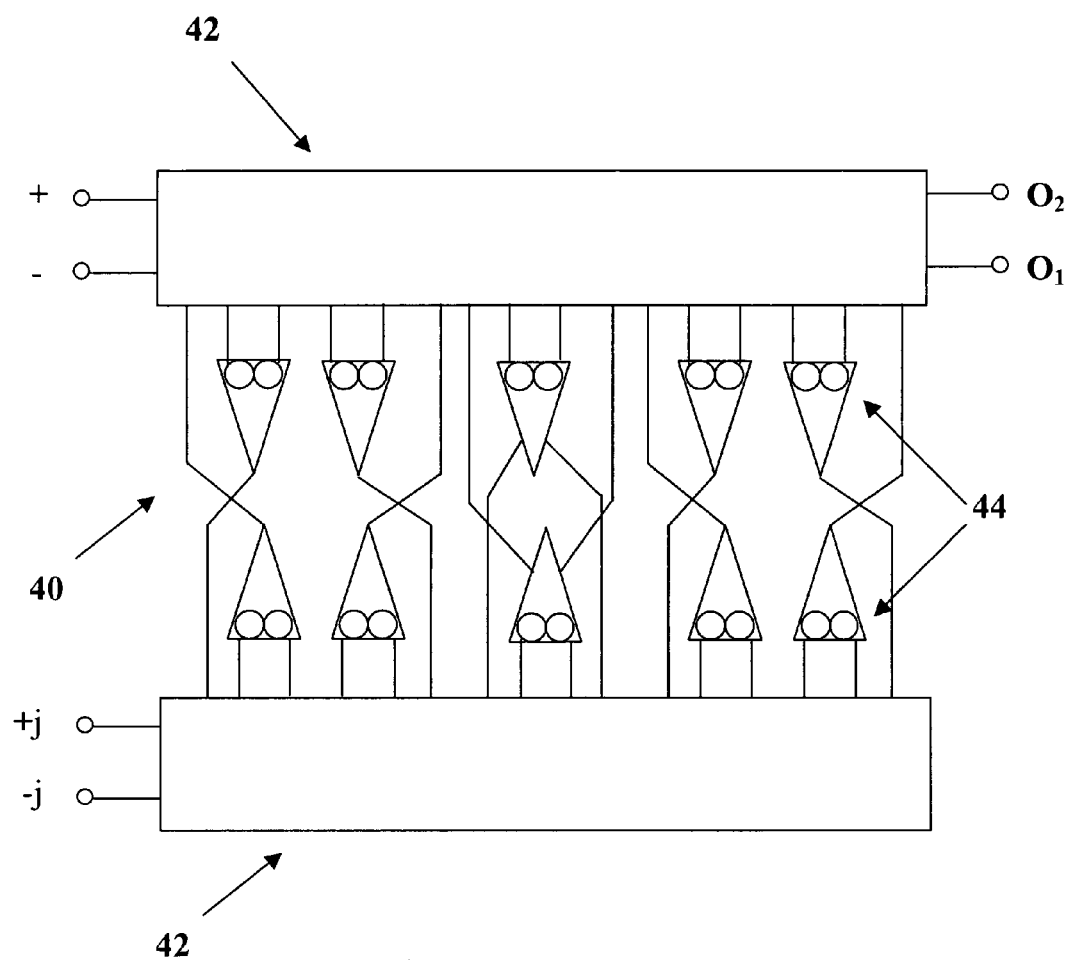
Figure 5A:
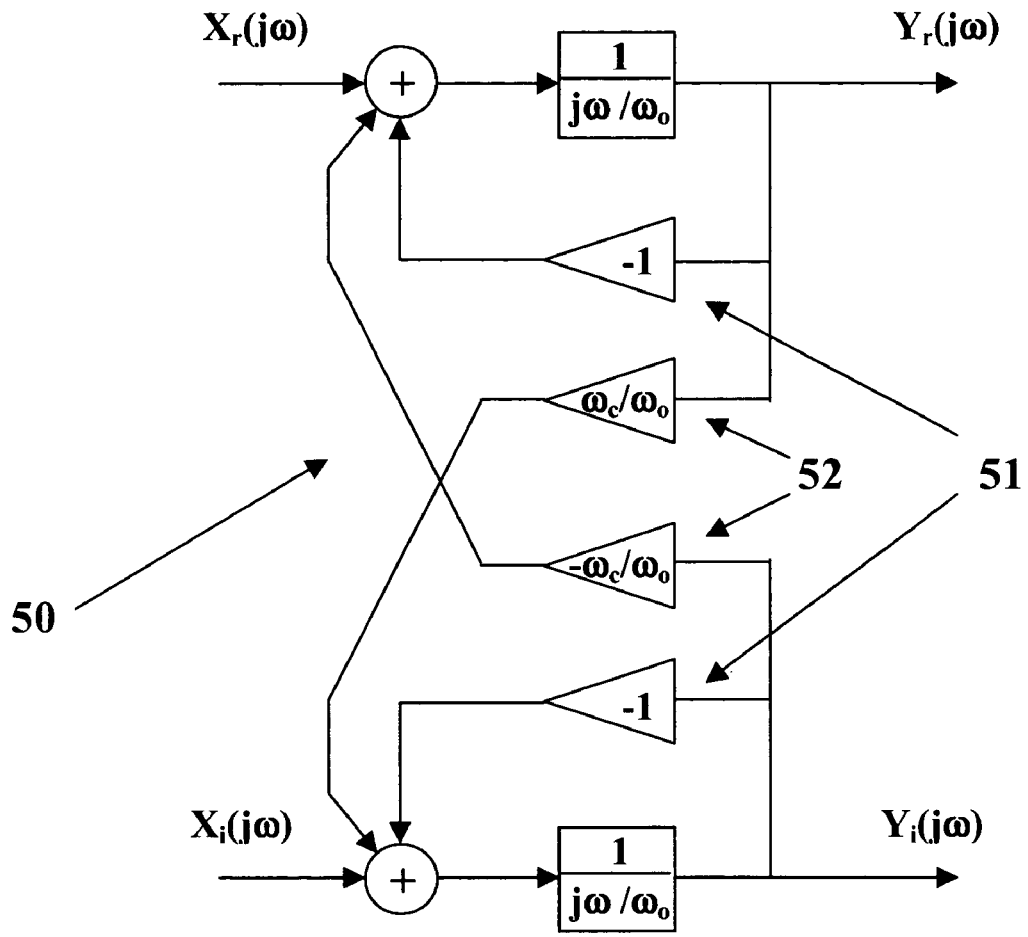
Figure 5B:
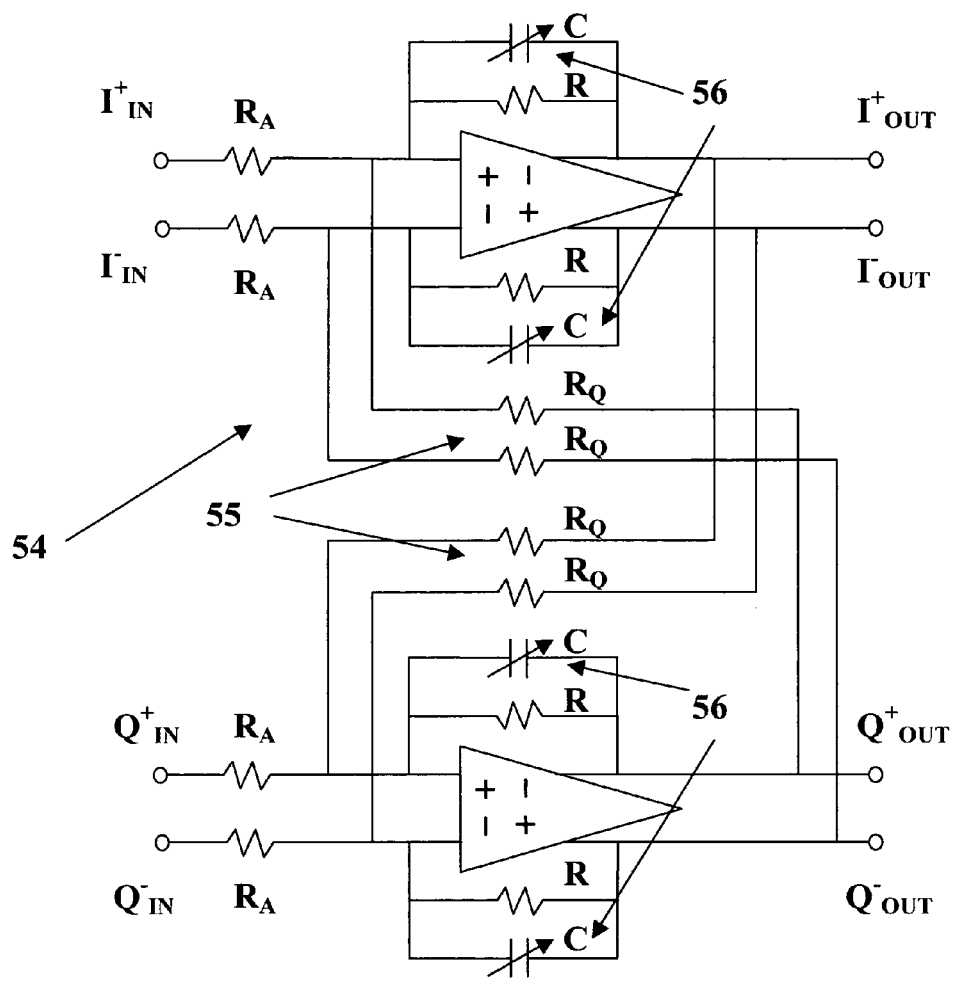
Figure 6:
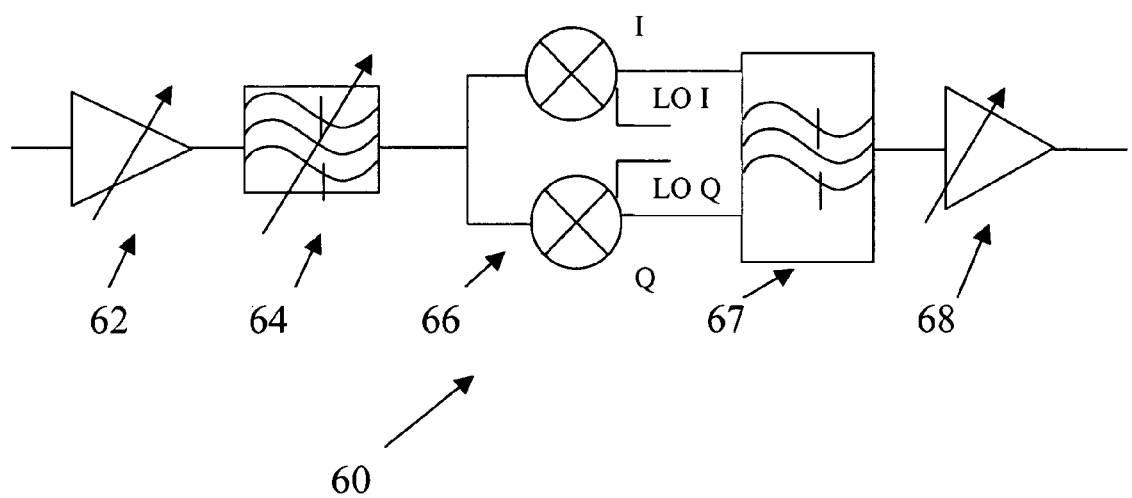
FIG. 6 is the block diagram of a wireless receiver equipped with the present active complex IF BP filter with transmission zeros.
Figure 7:
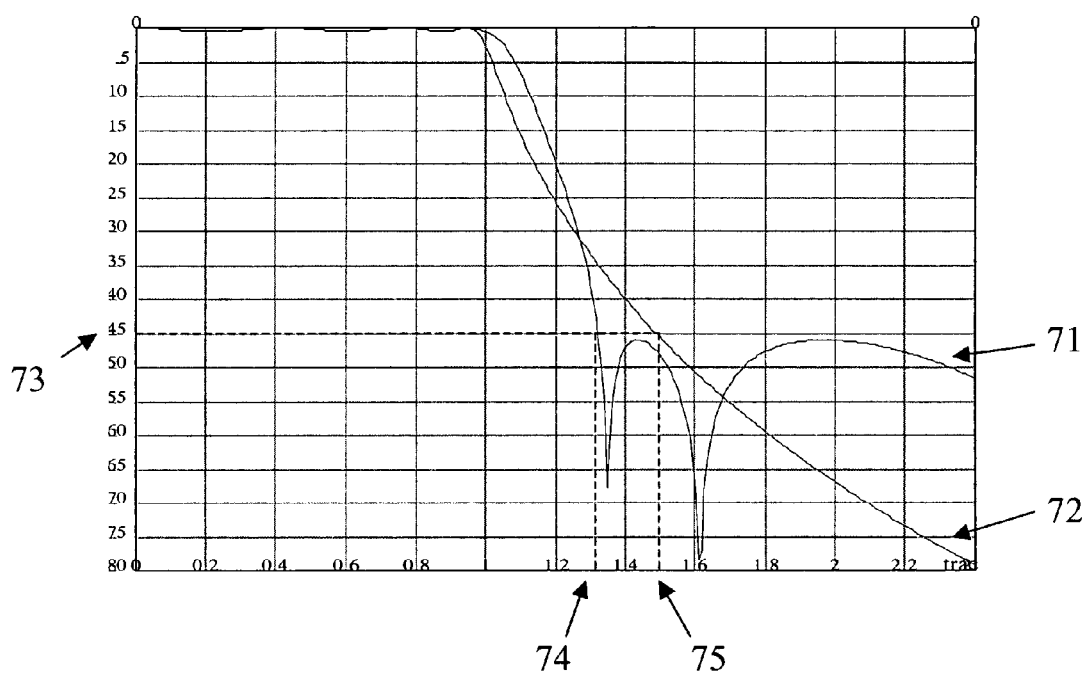
FIG. 7 illustrates the filter attenuation for a complex IF BP filter with transmission zeros and a complex all-pole IF BP filter.
Figure 8:
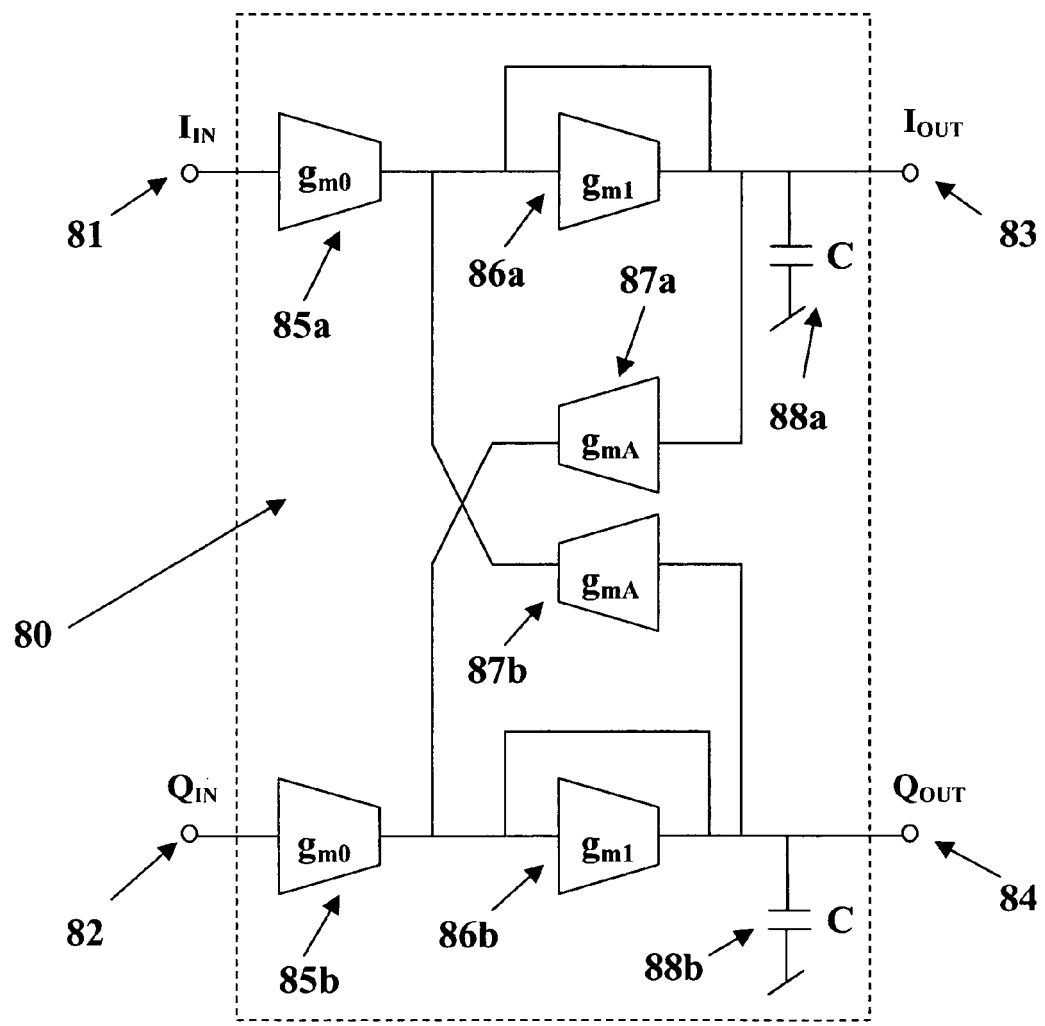
FIG. 8 illustrates the circuit arrangement for a first-Order section of the present active complex all-pole BP filter.

Referring to FIG. 8, a first-Order lowpass section of the present active complex all-pole bandpass filter is illustrated, and is generally identified by the numeral 80. The input signals enter the section inputs 81 and 82. The input signals are in quadrature such that if the phase of the input 81 is 0 degrees the phase of the input 82 is lagging the input 81 by 90 degrees. The input 81 is labeled I and the input 82 is labeled Q. The outputs of the filter section 80 are also in quadrature. The output 83 with phase 0 degrees is labeled I and the output 84 that is lagging output 83 by 90 degrees is labeled Q.

The lowpass section 80 realizes one complex pole and consists of six transconductors and two capacitors. The input transconductors $g_{m0}$ (85a and 85b) set up the section gain. The $1/g_{m1}$ resistors of transconductors (86a and 86b) and capacitors C (88a and 88b) form a real pole at the frequency $g_{m1}/C$ that is shifted by transconductors $g_{mA}$ 87a and 87b in a cross-coupled configuration by a frequency vector proportional to $g_{mA}$. Capacitors C (88a and 88b) can be realized as grounded, differential, or a combination of both types.

The transfer function of the lowpass sections 80 from the input 81 to the output 83 is the same as that from the input 82 to the output 84 and can be expressed as:

$$H_1(j\omega) = \frac{g_{mOI}}{g_{mI} + j\omega_1 C - jg_{mA}}. \quad (1)$$

The equation for $H_1$ gives the insight into how the actual complex bandpass filter transfer function is constructed. The lowpass prototype pole can be either a real or a complex pole. If a real pole is to be converted the initial $g_{mA}$ is set to 0. Then, the $g_{mA}/C$ is the actual frequency shift, or the center frequency for the complex bandpass. If a complex pole is being converted the initial $g_{mA}$ is set to the value of the imaginary part of that pole. Then, the same $g_m$-value is added as in the case of the real pole. The conjugate pole can be realized by switching the polarity of the initial $g_{mA}$-value to yield the transfer function:

$$H_2(j\omega) = \frac{g_{mOI}}{g_{mI} + j\omega C - jg_{mA}}. \quad (2)$$

Figure 9:
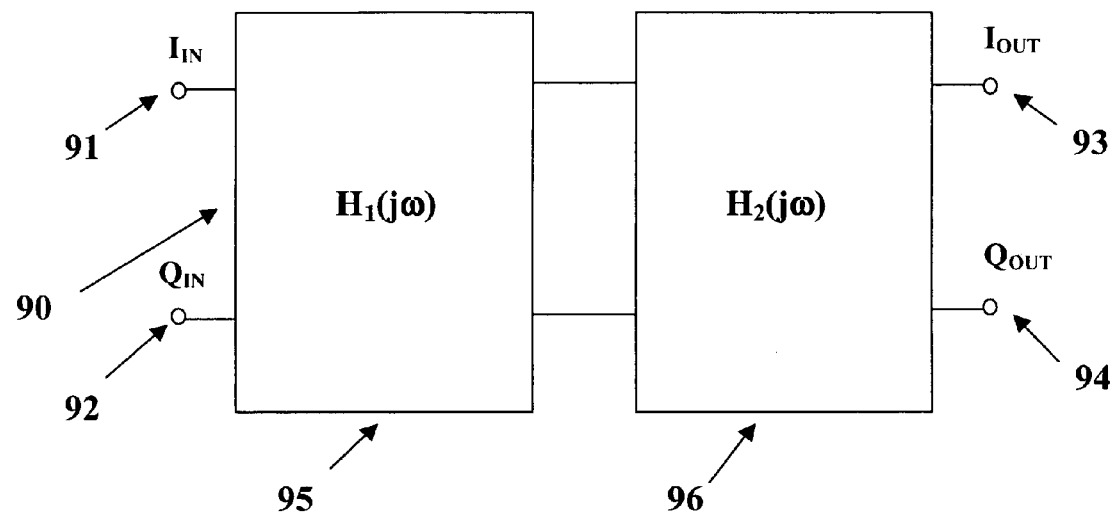
FIG. 9 illustrates the circuit arrangement for a second-Order section of the present active complex all-pole BP filter.

Referring to FIG. 9, a second-Order biquad section of the present active complex all-pole bandpass filter is illustrated, and is generally identified by the numeral 90. The biquad section 90 consists of two similar lowpass sections labeled 95 and 96, each of which realize one conjugate complex pole. The transfer function of the biquad section 90 is a cascade of the two lowpass section transfer functions and can be expressed as:

$$H_1(j\omega) * H_2(j\omega) = \quad (3)$$

$$\frac{g_{mOI}g_{mO2}}{(g_{mI} + j\omega C)^2 - j^2 g_{mA}^2} = \frac{g_{mOI}g_{mO2}}{g_{mI}^2 + 2j\omega g_{mI}C + (j\omega)^2 C^2 + g_{mA}^2}$$

The transfer functions of the filter section 90 from the input 91 to the output 93 and from the input 92 to the output 94 are identical and can be expressed in s-domain, with $s=j\omega$ as:

$$H(s) = \frac{\frac{g_{mOI}g_{mO2}}{C^2}}{\frac{g_{mI}^2 + g_{mA}^2}{C^2} + s\frac{2g_{mI}}{C} + s^2}. \quad (4)$$

H(s) represents a pair of conjugate complex poles with their pole frequency expressed as:

$$\omega_0 = \frac{g_{mI}}{C}\sqrt{1 + \left(\frac{g_{mA}}{g_{mI}}\right)^2} \quad (5)$$

and their Q-factor expressed as:

$$Q = \frac{1}{2}\sqrt{1 + \left(\frac{g_{mA}}{g_{mI}}\right)^2}. \quad (6)$$

Figure 10:
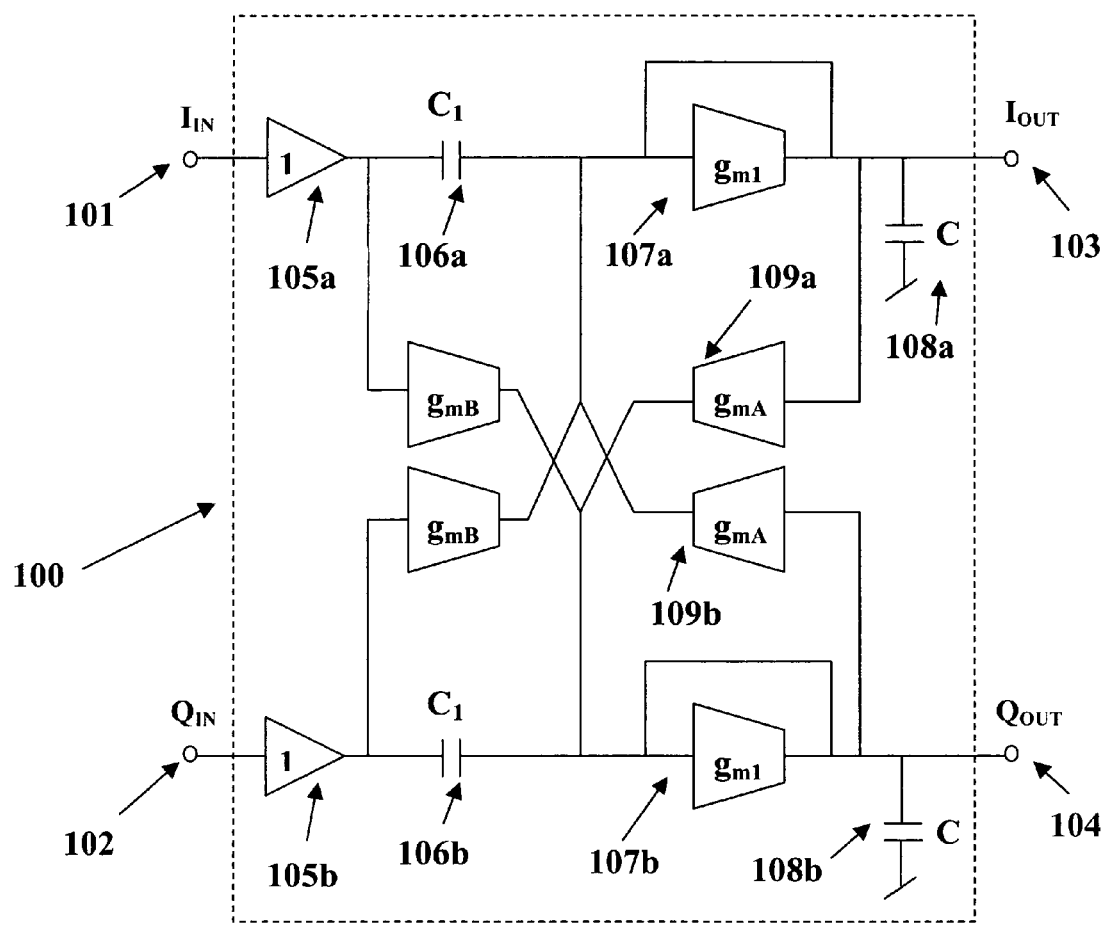
FIG. 10 illustrates the circuit arrangement for a first-Order section of the present active complex BP filter with transmission zeros.

Referring to FIG. 10, a first-Order lowpass section of the present active complex bandpass filter with transmission zeros is illustrated, and is generally identified by the numeral 100. The input signals enter the filter section inputs 101 and 102. The input signals are in quadrature such that if the phase of the input 101 is 0 degrees the phase of the input 102 is lagging the input 101 by 90 degrees. The input 101 is labeled I and the input 102 is labeled Q. The outputs of the filter section 100 are also in quadrature. The output 103 with phase 0 degrees is labeled I and the output 104 that is lagging output 103 by 90 degrees is labeled Q.

The lowpass section 100 realizes one complex pole and one imaginary axis zero and consists of two unity-gain voltage buffers, six transconductors and four capacitors. The input voltage buffers "1" (105a and 105b) drive capacitors $C_1$ (106a and 106b) with their low output impedance. The $1/g_{m1}$ resistors made of transconductors 107a and 107b form with capacitors $C_1$ (106a and 106b) and C (108a and 108b) a real pole at $g_{m1}/(C_1+C)$ that is shifted by transconductors $g_{mA}$ (109a and 109b) in a cross-coupled configuration by a frequency vector proportional to $g_{mA}$. Capacitors C (108a and 108b) can be realized as grounded, differential, or a combination of both types.

The transfer function of the lowpass sections 100 from the input 101 to the output 103 is the same as that from the input 102 to the output 104 and is expressed as:

$$H_3(j\omega) = \frac{j\omega C_1 + jg_{mB}}{g_{mI} + j\omega(C_1 + C) + jg_{mA}}. \quad (7)$$

It contains a purely imaginary axis zero at the frequency $g_{mB}/C_1$ created by feeding forward the input signal across the input capacitors $C_1$ (106a and 106b). The equation for $H_3$ gives the insight into how the actual complex bandpass filter transfer function is constructed. The lowpass prototype pole can be either a real or a complex pole. If a real pole is to be converted the initial $g_{mA}$ is set to 0. Then the $g_{mA}/C$ is the actual frequency shift, or the center frequency for the complex bandpass. If a complex pole is being converted the initial $g_{mA}$ is set to the value of the imaginary part of that pole. Then the same $g_m$-value is added as in the case of the real pole. The conjugate pole and zero can be realized by switching the polarity of the initial $g_{mA}$- and $g_{mB}$-values to yield the transfer function:

$$H_4(j\omega) = \frac{j\omega C_1 - jg_{mB}}{g_{mI} + j\omega(C_1 + C) - jg_{mA}}. \quad (8)$$

Figure 11:
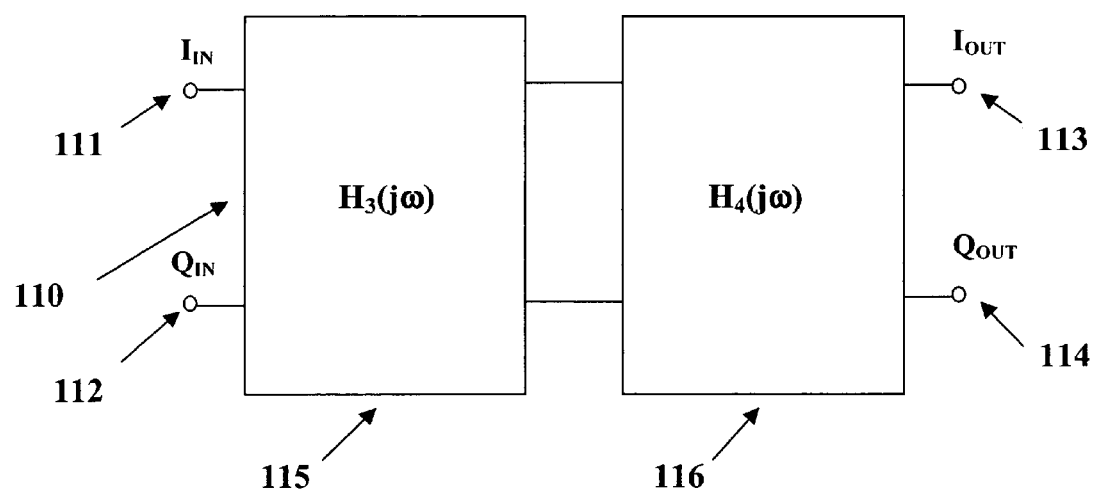
FIG. 11 illustrates the circuit arrangement for a second-Order section of the present active complex BP filter with transmission zeros.

Referring to FIG. 11, a second-Order biquad section of the present active complex bandpass filter with transmission zeros is illustrated, and is generally identified by the numeral 110. The biquad section 110 consists of two similar lowpass sections labeled 115 and 116, each of which realizes one conjugate complex pole and one imaginary axis zero. The transfer function of the biquad section 110 is a cascade of the two lowpass section transfer functions and can be expressed as:

$$H_3(j\omega) * H_4(j\omega) = \frac{(j\omega)^2 C_1^2 + g_{mB}^2}{(g_{mI} + j\omega(C_1 + C))^2 - j^2 g_{mA}^2} = \quad (9)$$

$$\frac{(j\omega)^2 C_1^2 + g_{mB}^2}{g_{mI}^2 + 2j\omega g_{mI}(C_1 + C) + (j\omega)^2(C_1 + C)^2 + g_{mA}^2}.$$

The transfer functions of the filter sections 110 from the input 111 to the output 113 and from the input 112 to the output 114 are identical and can be expressed in s-domain, with $s=j\omega$ as:

$$H(s) = \frac{s^2 C_1^2 + g_{mB}^2}{g_{mI}^2 + 2sg_{mI}(C_1 + C) + s^2(C_1 + C)^2 + g_{mA}^2} = \quad (10)$$

$$\frac{C_1^2}{(C_1 + C)^2} \frac{\frac{g_{mB}^2}{C_1^2} + s^2}{\frac{g_{mI}^2 + g_{mA}^2}{(C_1 + C)^2} + s \frac{2g_{mI}}{(C_1 + C)} + s^2}$$

H(s) represents pair of conjugate complex poles and a double imaginary axis zero with their pole frequency expressed as:

$$\omega_0 = \frac{g_{mI}}{C_1 + C} \sqrt{1 + \left(\frac{g_{mA}}{g_{mI}}\right)^2} \quad (11)$$

their Q-factor expressed as:

$$Q = \frac{1}{2} \sqrt{1 + \left(\frac{g_{mA}}{g_{mI}}\right)^2} \quad (12)$$

and the zero frequency expressed as:

$$\omega_z = \frac{g_{mB}}{C_1} \quad (13)$$

Figure 12:
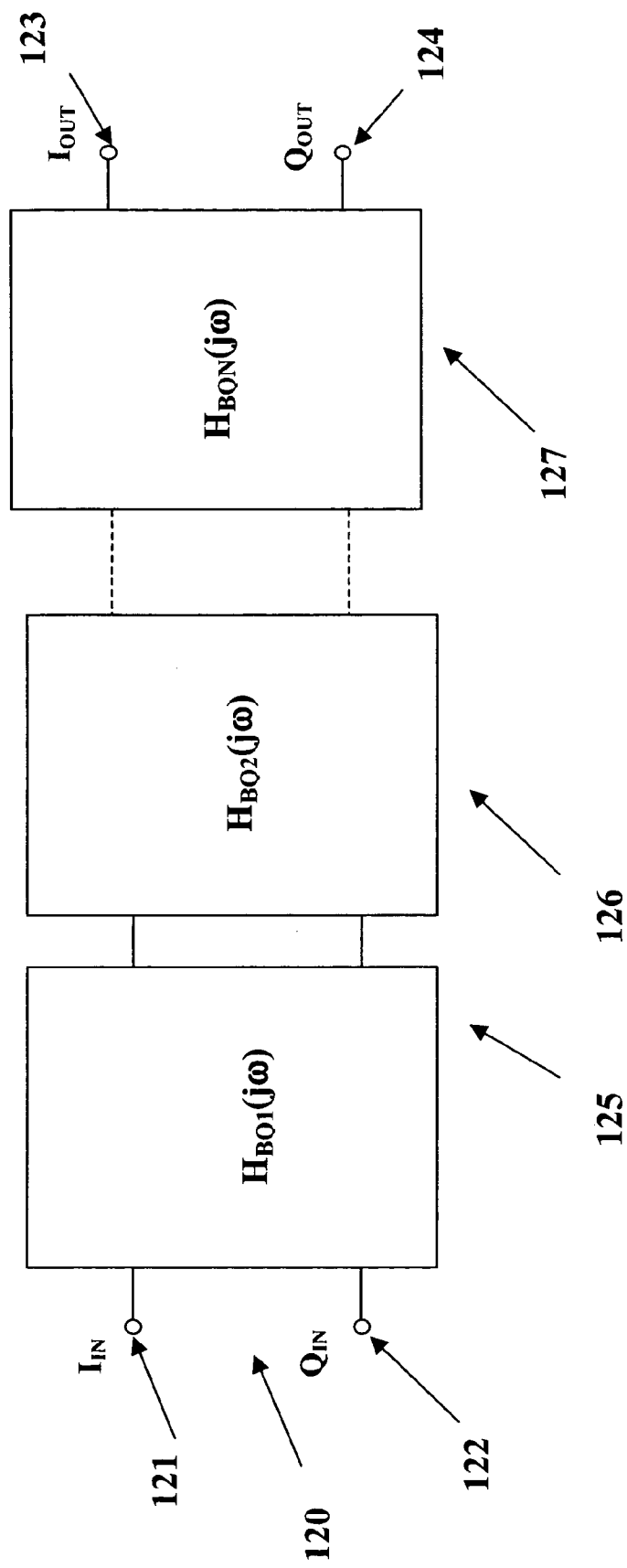
FIG. 12 illustrates the circuit arrangement for the present active complex BP filter with transmission zeros for an even-Order lowpass prototype as a cascade of second-Order sections.

Referring to FIG. 12, the present active complex BP filter with transmission zeros is illustrated, and is generally identified by the numeral 120. As illustrated in FIG. 12, the present complex BP 120 has an even-Order lowpass (LP) prototype. In such a case, each of its biquad sections 125, 126 and 127 realizes a pair of complex poles and may add no zeros, a single, a double, or two different imaginary axis zeros to the overall transfer function.

Figure 13:
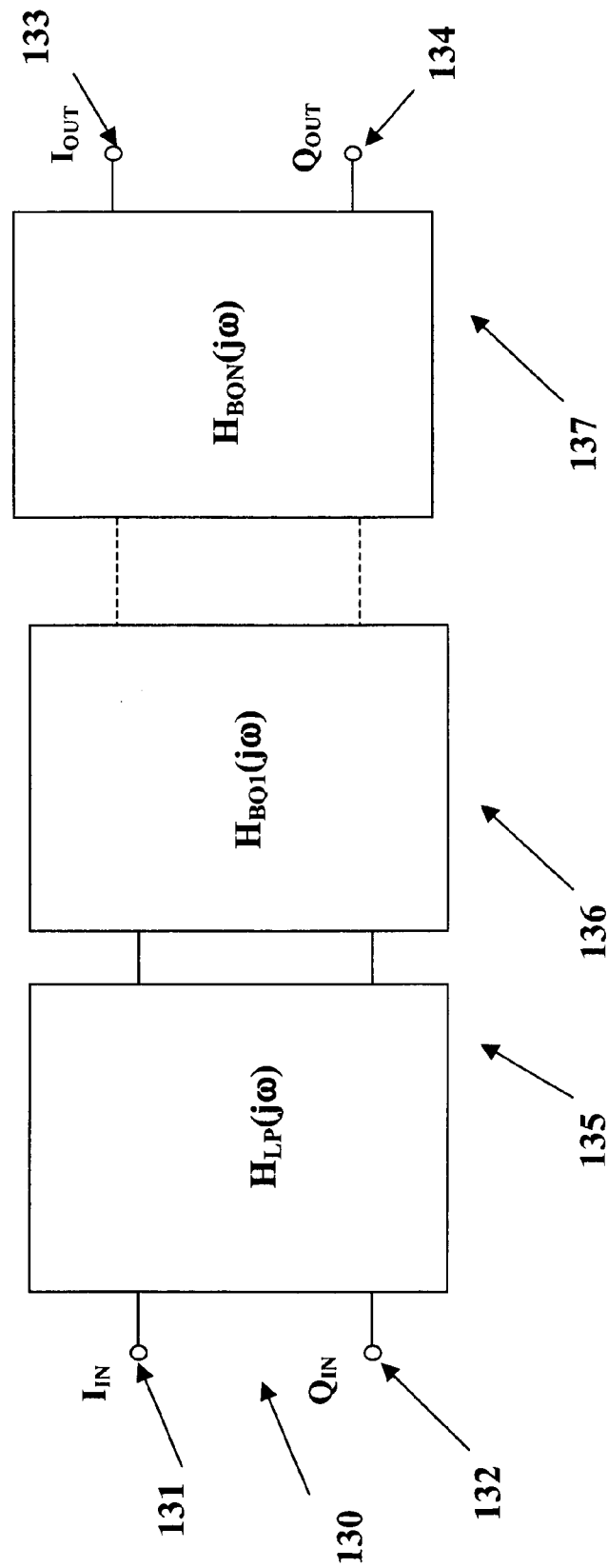
FIG. 13 illustrates the circuit arrangement for the present active complex BP filter with transmission zeros for an odd-Order lowpass prototype as a cascade of first- and second-Order sections.

Referring to FIG. 13, the present active complex BP filter with transmission zeros is illustrated, and is generally identified by the numeral 130. As illustrated in FIG. 13, the present complex BP 130 has an odd-Order LP prototype. In such a case, the lowpass section 135 realizes a real pole and it can implement no zeros, or a single imaginary axis zero. Each of its biquad sections 136 and 137 realizes a pair of complex poles and may add no zeros, a single, a double, or two different imaginary axis zeros to the overall transfer function.

Other alteration and modification of the invention will likewise become apparent to those of ordinary skill in the art upon reading the present disclosure, and it is intended that the scope of the invention disclosed herein be limited only by the broadest interpretation of the appended claims to which the inventor is legally entitled.

I claim:

1. A continuous-time active complex bandpass filter: comprising:
    a filter having a transfer function having poles and imaginary zeros and generated using only a plurality of transconductors, capacitors and buffers, including:
    I input and 90-degree phase shifted Q input;
    I output and 90-degree phase shifted Q output;
    cross-coupled transconductors for shifting the position of the transfer function poles to form an unsymmetrical complex bandpass transfer function that transmits signals for positive frequencies and blocks signals for negative frequencies; or transmits signals for negative frequencies and blocks signals for positive frequencies; and
    cross-coupled transconductors for creating the transfer function imaginary zeros into an unsymmetrical complex bandpass transfer function.

2. The continuous-time active complex bandpass filter of claim 1 wherein the transfer function includes an all-pole system.

3. The continuous-time active complex bandpass filter of claim 1 wherein said filter is fabricated in monolithic technology selected from the group consisting of silicon CMOS, BiCMOS and bipolar processes.

4. The continuous-time active complex bandpass filter of claim 2 wherein said filter is fabricated as an on-chip active device.

5. The continuous-time active complex bandpass filter of claim 2 and further including:
    a first-Order lowpass filter section having:
    I input and 90-degree phase shifted Q input;
    I output and 90-degree phase shifted Q output;
    a pair of input transconductors for setting up the filter section gain;
    a pair of $1/g_m$ resistors connected to said input transconductors and a pair of capacitors each having a value of C, connected to said pair of resistors to form a filter section pole at frequency $g_m/C$; and
    a pair of cross-coupled transconductors $g_{mA}$ connected to said input transcondutor and said pair of resistors to shift the position of the said pole to a complex location at $(g_m+jg_{mA})/C$, or $(g_m-jg_{mA})/C$.

6. The continuous-time active complex bandpass filter of claim 5 and further including:
    a second-Order biquad filter including a cascaded pair of said first-Order lowpass filter sections wherein said lowpass filter sections create a pair of complex conjugate poles at $(g_m \pm jg_{mA})/C$.

7. The continuous-time active complex bandpass filter of claim 1 wherein said filter is fabricated as an on-chip active device.

8. The continuous-time active complex bandpass filter of claim 1 and further including:
    a first-Order lowpass filter section having:
    a pair of input unity-gain buffers;
    a pair of input capacitors having a value $C_1$ connected to said buffers;
    a pair of $1/g_m$ resistors connected to said input capacitors;
    a pair of output capacitors having a value C connected to said pair of resistors to form a filter section pole at frequency $g_m/(C+C_1)$;
    a first pair of cross-coupled transconductors $g_{mA}$ connected to said output capacitors and said resistors to shift the position of the said pole to a complex location at $(g_m+jg_{mA})/(C+C_1)$, or $(g_m-jg_{mA})/(C+C_1)$; and
    a second pair of cross-coupled transconductors $g_{mB}$ connected to said input capacitors and said resistors to form an imaginary axis zero at $jg_{mB}/C_1$.

9. The continuous-time active complex bandpass filter of claim 8 and further including:
    a second-Order biquad filter section including a cascaded pair of said first-Order lowpass filter sections wherein said lowpass filter sections create a pair of complex conjugate poles at $(g_m \pm jg_{mA})/(C_1+C)$.

10. The continuous-time active complex bandpass filter of claim 9 having a lowpass prototype of an even-Order.

11. The continuous-time active complex bandpass filter of claim 10 and further including:
   at least one second-order biquad filter section containing no zeros, a single, a double, or two different imaginary axis zeros.

12. The continuous-time active complex bandpass filter of claim 9 having a lowpass prototype of an odd-Order.

13. The continuous-time active complex bandpass filter of claim 12 and further including:
   one first-order lowpass filter section containing no zeros, or a single imaginary axis zero; and
   at least one second-order biquad filter section containing no zeros, a single, a double, or two different imaginary axis zeros.

* * * * *